United States Patent [19]

Kurakami et al.

[11] 4,357,747
[45] Nov. 9, 1982

[54] METHOD FOR PRODUCING A SEMICONDUCTOR DEVICE HAVING AN INSULATED GATE TYPE FIELD EFFECT TRANSISTOR

[75] Inventors: Osamu Kurakami; Shigeru Koshimaru; Takashi Yamanaka, all of Tokyo, Japan

[73] Assignee: Nippon Electric Co., Ltd., Tokyo, Japan

[21] Appl. No.: 192,401

[22] Filed: Sep. 30, 1980

Related U.S. Application Data

[62] Division of Ser. No. 942,729, Sep. 15, 1978, Pat. No. 4,268,847.

[30] Foreign Application Priority Data

Sep. 16, 1977 [JP] Japan ................................ 52-112067
Sep. 16, 1977 [JP] Japan ................................ 52-112068
Dec. 28, 1977 [JP] Japan ................................ 52-158000

[51] Int. Cl.$^3$ .......................................... H01L 21/26
[52] U.S. Cl. ................................. 29/571; 29/576 B; 148/187
[58] Field of Search ............... 29/571, 576 B; 148/1.5, 148/187; 357/23

[56] References Cited

U.S. PATENT DOCUMENTS

| | | | |
|---|---|---|---|
| 3,752,711 | 8/1973 | Kooi et al. ........................ | 29/571 X |
| 4,114,255 | 9/1978 | Salsbury et al. .................... | 29/571 |
| 4,118,728 | 10/1978 | Berry ................................ | 357/50 X |
| 4,137,109 | 1/1979 | Aiken et al. ...................... | 148/187 X |
| 4,149,904 | 4/1979 | Jones ................................ | 148/1.5 |
| 4,173,819 | 11/1979 | Kinoshita ......................... | 29/571 |
| 4,268,847 | 5/1981 | Kurakami et al. ................. | 357/52 |

OTHER PUBLICATIONS

Coe et al., *Electronics,* Feb. 19, 1976, pp. 116–121.
Faggin et al., *Electronics,* Sep. 20, 1969, pp. 88–94.
Stein et al., *IEEE J. Of Solid State Circuits,* vol. SC-7, No. 5, Oct. 1972, pp. 336–340.

*Primary Examiner*—G. Ozaki
*Attorney, Agent, or Firm*—Sughrue, Mion, Zinn, Macpeak & Seas

[57] ABSTRACT

An insulated gate type field effect transistor forming one cell of a high density integrated circuit semiconductor memory device and a method for producing the same are disclosed. A channel stopper region of the same conductivity type as the substrate but having a higher impurity concentration is disposed contiguous to the width edge of the channel region, and a thick field oxide film is provided outside of the channel stopper region. The channel stopper region is self-aligned with the width edges of the gate electrode, and an insulator film having a thinner film thickness than that of the thick field oxide film is formed on the channel stopper region. In one embodiment, a second channel stopper region similar to the first is provided at the surface of the substrate under the field oxide film. A capacitor region is associated with the field effect transistor, and together they form a memory cell which is substantially surrounded by an isolating region including the thick field oxide film.

5 Claims, 13 Drawing Figures

METHOD FOR PRODUCING A SEMICONDUCTOR DEVICE HAVING AN INSULATED GATE TYPE FIELD EFFECT TRANSISTOR

This is a divisional application of co-pending U.S. patent application Ser. No. 942,729 filed Sept. 15, 1978 now U.S. Pat. No. 4,268,847.

BACKGROUND OF THE INVENTION

1. Field of the Invention

The present invention relates to a semiconductor device having an insulated gate type field effect transistor and a method for producing the same, and more particularly, to an insulated gate type field effect transistor forming one cell of a semiconductor memory device and a method for producing the same.

2. Description of the Prior Art

In recent years, the degree of integration of semiconductor integrated circuit devices and especially of semiconductor memory devices has become higher and higher, and accordingly miniaturization of an insulated gate type field effect transistor to be used in such devices becomes essentially necessary. The respective field effect transistors in an integrated circuit device are formed within active regions substantially surrounded by an isolating region including a thick field oxide film. Each transistor includes source and drain regions and a channel region between these two regions, or one of the source and drain regions and channel region extending from that one region. In the prior art device, the edges of the channel region in the widthwise direction, that is, in the perpendicular direction with respect to a direction from the source to the drain, are contiguous to an isolating region which has the same construction as the isolating region adjacent to the source and drain regions, and therefore the widthwise dimension of the channel region is determined by the surrounding isolating region. As the transistors become further miniaturized, the widthwise dimension of the channel region becomes as small as several microns, and it becomes impossible to precisely realize a predetermined dimension of the channel region in the widthwise direction by means of the isolating region including a thick field oxide film of about 1 $\mu$m in thickness. In addition, where the isolating region includes a so-called channel stopper region which is formed at the surface of the semiconductor substrate directly under the thick field oxide film and has a higher impurity concentration than and the same conductivity type as the substrate, this high concentration channel stopper region inevitably protrudes into the channel region when the thick field oxide film is formed by thermal oxidation. Since the extent of this protrusion depends upon the conditions of the above-described thermal oxidation and the thickness of the oxide film, it is impossible to control the widthwise dimension of the channel region precisely at a desired dimension. Furthermore, the width edges of the channel region are defined by the insulative isolating region including the thick field oxide film as described above, and consequently not self-aligned with the width edges of a gate electrode. Accordingly, the widthwise dimension of the gate electrode must be larger than that of the channel region by several microns, taking into consideration an allowance for alignment of the gate electrode with the channel region. This is disadvantageous in view of the degree of integration.

SUMMARY OF THE INVENTION

Therefore, an object of the present invention is to provide a semiconductor device having an insulated gate type field effect transistor in which the widthwise dimension of the channel region is defined with good accuracy.

Another object of the present invention is to provide a semiconductor device having an insulated gate type field effect transistor in which width edges of the channel region are self-aligned with width edges of the gate electrode.

Still another object of the present invention is to provide a high-density semiconductor device in which the width of the gate electrode is reduced to miniaturize the size of an insulated gate type field effect transistor.

Yet another object of the present invention is to provide a high-density semiconductor memory device including miniaturized insulated gate type field effect transistors in which the widthwise dimension of the channel region can be defined precisely at a predetermined value and a width of a gate electrode is reduced.

A further object of the present invention is to provide a high-density semiconductor memory device of the type described in which a capacitor section is connected to the channel region to form one memory cell.

A still further object of the present invention is to provide a method for producing the above-mentioned semiconductor device including an effective insulated gate type field effect transistor with an improved yield.

According to one feature of the present invention, there is provided a semiconductor device comprising a semiconductor substrate of one conductivity type, a source and/or drain region of the opposite conductivity type formed at one major surface of said substrate, a channel region extending from the source and/or drain region along the one major surface, a first channel stopper region of the one conductivity type having a higher impurity concentration than the semiconductor substrate and disposed contiguous to the width edge of the channel region, and a thick field oxide film provided outside of the first channel stopper region.

According to another feature of the present invention, there is provided a semiconductor device of the type described in which a second channel stopper region of the one conductivity type having an impurity concentration higher than the semiconductor substrate is provided at the surface of the substrate under the field oxide film.

According to yet another feature of the present invention, there is provided the first-featured semiconductor device in which a gate insulator film is provided on the channel region with a gate electrode, preferably made of polcrystalline silicon, provided on the gate insulator film, and the first channel stopper region is formed in a self-aligning mode with the gate electrode.

According to a further feature of the present invention, there is provided the above-featured semiconductor device in which on the first channel stopper region is provided with either an insulator film extending from the gate insulator film or an insulator film different from the gate insulator film. In this case, if the object of the present invention is taken into consideration, then it is necessary to form this insulator film thinner than the field oxide film. Therefore, in order to make the region contiguous to the width edges of the channel region of the transistor inside of the thick field oxide film having a threshold voltage substantially equal to the threshold voltage of the isolating region consisting of the second channel stopper region and the thick field oxide film, it is necessary to select the impurity concentration of the first channel stopper region higher than that of the second channel stopper region.

The impurity concentration of the first channel stopper region preferably ranges from $10^{16}$ to $10^{19}/cm^3$, and the thickness of the insulator film formed on the first channel stopper region preferably ranges from 1000 to 5000 A. Such a thin insulator film may be formed without disturbing the shape and size of the first channel stopper region and accordingly those of the channel region. It is preferred to form the first channel stopper region by ion implantation through this thin insulator film, in order to very precisely obtain the desired shape and size of the first channel stopper region and accordingly those of the channel region.

According to another aspect of the present invention, there is provided a semiconductor memory device in which edges of the channel region in its widthwise direction are abutted and defined by the first channel stopper region while one and the other ends of the channel region in its lengthwise direction are abutted and defined by a drain or source region connecting to a bit line and by a capacitor section, respectively.

According to still another aspect of the present invention, there is provided a method for producing the semiconductor device, comprising the steps of forming a thick field oxide film on a semiconductor substrate of one conductivity type, forming a gate insulator film on one major surface of the semiconductor substrate as surrounded by the thick field oxide film, depositing on the gate insulator film a polycrystalline silicon film to be formed into a gate electrode, shaping the width edges of the gate electrode, introducing an impurity of the one conductivity type into said semiconductor substrate between the width edges of the gate electrode and the thick field oxide film opposed thereto to form a channel stopper region, shaping the length edge or edges of the gate electrode, and introducing an impurity of the opposite conductivity type into the one major surface of the semiconductor substrate between the length edge or edges of the gate electrode and the thick field oxide film opposed thereto to form source and/or drain regions.

The thick field oxide film may be replaced by other insulating films such as silicon nitride film, phosphosilicate glass film, and a combination of silicon oxide film and such film or films. The thick field oxide film may be formed on the surface of the semiconductor substrate, or may be partially or wholly embedded in the surface of the semiconductor substrate.

DETAILED DESCRIPTION OF THE PRIOR ART

Figure 1A:
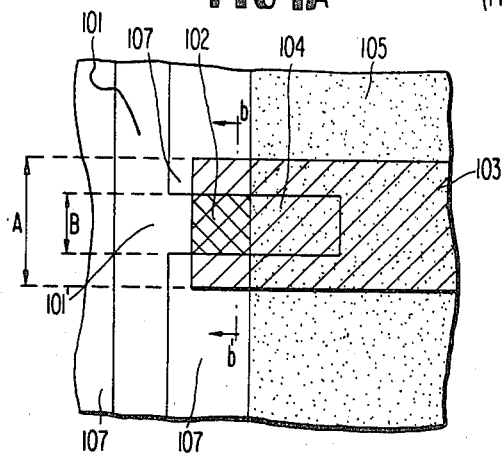
FIG. 1A is a plan view of a prior art semiconductor device.
Figure 1B:
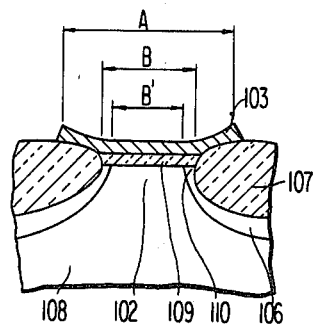
FIG. 1B is a cross-sectional view of the same taken along the line b—b' in FIG. 1A as viewed in the direction of arrows.

FIGS. 1A and 1B shows a single-transistor type semiconductor memory cell in the prior art which consists of an insulated gate type field effect transistor and an insulated gate type capacitor. A thick field oxide film 107 of about 1 $\mu$m in thickness defines a width B of about 5 $\mu$m of a channel section 102 shown with the double-cross hatching, while a gate electrode 103 shown with the single cross hatching has a larger width A, a margin (A-B) of several microns being necessary in the widthwise direction of the transistor in view of the allowance for alignment between them. In addition, a deviation of ±0.5 $\mu$m will arise in the width B depending upon the forming conditions of the thick field oxide film 107, such as the conditions of the photoresist process, etching process of an oxidation barrier mask, and selective thermal oxidation process, where a transistor having a channel width of, for example, 5 $\mu$m is produced. In other words, a deviation of ±10% from the designed value for B will occur. Still further, where a P+-type channel stopper region 106 is provided under the thick field oxide film 107, a protrusion 110 of about 0.5 $\mu$m will inevitably arise into the channel section 102 of the transistor due to its manufacturing process, so that the effective channel width B' of the transistor will be reduced to 4 $\mu$m. Since the extent of this protrusion 110 will vary depending upon the forming conditions of the field oxide film, the channel width of the transistor will have a larger deviation value than the above-described value. It is to be noted that in FIGS. 1A and 1B, a P-type substrate 108 is used, in which an elongated N-type bit region 101 is formed. The section 101' of the N-type bit region 101 that is contiguous to the channel section 102 forms a source region of the transistor. A surface region 104 contiguous to the channel region 102 serves as a lower electrode of the capacitor, and an upper electrode 105 (shown with the stippling) of the capacitor covers the region 104 with interposition of a thin insulating film (not shown). A numeral 109 designates a gate oxide film of the transistor. The bit region 101, source region 101', channel region 102 and the capacitor region 104 are surrounded by the thick field oxide film 107.

Semiconductor devices in the prior art are disclosed, for example, by Stein et al., "Storage Array and Sense/Refresh Circuit for Single Transistor Memory Cells," *IEEE Journal of Solid-State Circuits*, Vol. SC-7, No. 5, October 1972, pp. 336–340, Coe et al., "Enter the 16,384-bit RAM," Electronics, Feb. 19, 1976, pp. 116–121, and Faggin et al., "A Faster Generation for MOS Devices with Low Thresholds is Riding the Crest of the New Wave, Silicon-gate IC's", Electronics, Sept. 29, 1969, pp. 88–94.

DESCRIPTION OF THE PREFERRED EMBODIMENTS

Figure 2A:
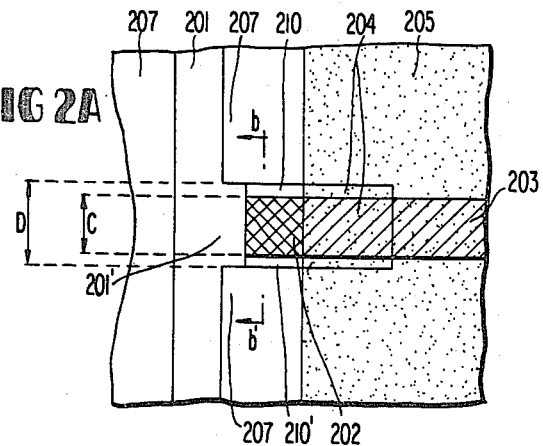
FIG. 2A is a plan view of a first preferred embodiment of the present invention.
Figure 2B:
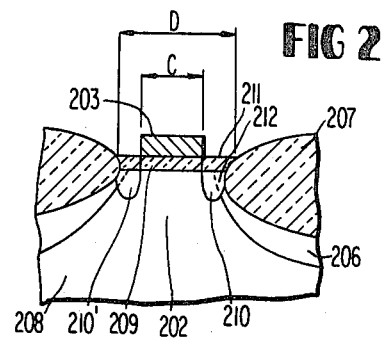
FIG. 2B is a cross-sectional view of the same taken along line b—b' in FIG. 2A as viewed in the direction of arrows.

Embodiment 1:

Referring to FIGS. 2A and 2B, a single transistor-type memory cell of a preferred embodiment of the present invention comprises a P-type semiconductor substrate 208 which includes, at its surface portion, an elongated N-type region 201 serving as a bit line for the memory cell, an N-type source region 201' of the transistor contiguous to the region 201, a channel section 202 contiguous to the source region 201', and the capacitor section 204, all of which are in turn surrounded by a thick field oxide film 207 embedded at the surface of the substrate 208. A thin gate insulator film 209 and a thin insulator film contiguous thereto cover the surface of the channel section, while a thin insulator film (not shown) serving as a dielectric layer of a capacitor covers the surface of the capacitor section 204 where an inverted N-type layer serving as a lower electrode of the capacitor is formed. An upper electrode 205 (shown by the stippling) of the capacitor covers the capacitor directric layer on the capacitor section 204 and a part of the thick field oxide layer 207. A gate electrode 203 (shown by the single cross hatching) of the transistor, made of, for example, polycrystalline silicon of 1000 A to 5000 A is formed on the gate insulator 209 and above the upper capacitor electrode 205. The gate electrode has width C of 5 $\mu$m that is narrower than a gap width D of 8 $\mu$m of the thick field oxide film 207 of 0.5 to 2.0 $\mu$m in thickness at the channel section. By making use of this gate electrode 203 as a mask, a gate oxide film 209 of 100 A to 2000 A has been selectively removed and thereafter, from the exposed surface of the P-type semiconductor substrate 208 having an impurity concentration of $10^{14} \sim 10^{16}$/cm$^3$ P-type impurity has been introduced by making use of the gate electrode 203 as a mask to form P$^+$-type regions 210 and 210' of the same conductivity type as and with a higher concentration than the substrate. These regions 210 and 210' have an impurity concentration of, for example, $10^{16} \sim 10^{19}$/cm$^3$ at a depth of $0.1 \sim 2.0$ $\mu$m, and they serve as channel stopper regions. The formation of these regions could be carried out either by ion implantation or by thermal diffusion. Especially where ion implantation is carried out, it may be effected through the gate insulator film without removing the gate insulator film, that is, with the gate insulator film kept extending to the thick field oxide film 207. In consequence, a channel region 202 (shown by the double-cross hatching) of the transistor is formed just below the gate electrode 203, surrounded by the channel stopper regions 210, 210', the source region 201' and the capacitor section 204. The width C of the channel region 202 can be defined without being restrained by the condition for forming the thick field oxide film 207. In addition, even if there exists a protrusion 212 of a P$^+$-type channel stopper region 206 under the thick field oxide film 207, it does not affect the width C of the channel region 202 of the transistor. Where the insulator film 211 on the channel stopper region 210, 210' according to the present invention is formed separately from the gate insulator film, it may be formed to have a thickness of 1000 A $\sim$ 5000 A. This film thickness is determined depending upon the impurity concentration of the channel stopper regions 210 and 210' as well as a threshold voltage at these regions.

Since the semiconductor device according to the present invention is constructed as described above, upon formation of the gate electrode 203, registration of a pattern can be achieved with a margin of (D-C), and on the other hand, the regions 210 and 210' can be formed in a self-aligning mode by means of the thick field oxide film 207 and the gate electrode 203, so that the density of integration is enhanced and the accuracy of manufacture is raised.

In the case of a P-type substrate, a first ion injection of boron may be effected to form the regions 210 and 210'. Thereafter, in the section 201 the injected boron is offset by diffusion of phosphorus ($\approx 10^{19} \sim 10^{20}$/cm$^3$), and thereby the section 201 becomes an N-type diffusion layer. Thereafter, while the section 201 has a thick oxide film ($\infty 0.5$ $\mu$m) formed thereon by thermal oxidation, the sections 210 and 210' having boron ions injected have a slow oxidation speed, so that only a thin oxide film is formed during this thermal oxidation step. Accordingly, the impurity concentration of the channel stopper regions 210 and 210' according to the present invention must be higher than that of the channel stopper region 206 under the field oxide film 207. For example, where the thickness of the thick field oxide film 207 is 1 $\mu$m and the impurity concentration of the channel stopper region 206 is $1 \times 10^{16}$/cm$^3$, the thin oxide film 211 formed on the region 201, 201' is 3,000 A and the impurity concentration of the channel stopper region 201, 201' of the present invention must be about $1 \times 10^{17}$/cm$^3$ or more. Then the threshold voltage of the region 210-211 contiguous to the width edges of the channel region 202 becomes substantially equal to that of the isolating region consisting of the thick field oxide film 207 and the channel stopper region 206.

The dimensions of the P$^+$-type channel stopper regions 210 and 210' may be different from each other by the deviation in the pattern alignment for the field oxide film 207, and where the deviation in the pattern alignment is the maximum, only of regions 210 and 210' may be present. It is to be noted that where the bit region 201 is to be formed after the regions 210 and 210' have been formed, then it is effected after an oxide film 211 has been provided on the regions 210 and 210', whereas in the opposite case, the regions 210 and 210' are formed after an insulator film has been provided on the bit region 201. Furthermore, in these steps, formation of the other regions could be carried out by covering with a photo-resist film without providing an oxide film or an insulator film. In addition, the formation of the regions 210 and 210' could be effected through an oxide film as described above, and the present invention is equally applicable to the case where an N-type substrate is employed on the contrary to the above-described preferred embodiment. It is also possible to apply the present invention to a depletion type where a region having a conductivity type opposite to that of the substrate 202 is formed under the oxide film 211 as a channel section. The channel stopper regions corresponding to the regions 210 and 210' in FIG. 2 are formed by converting the side portions of the channel section to the same conductivity type as that of the substrate 202.

Figure 3:
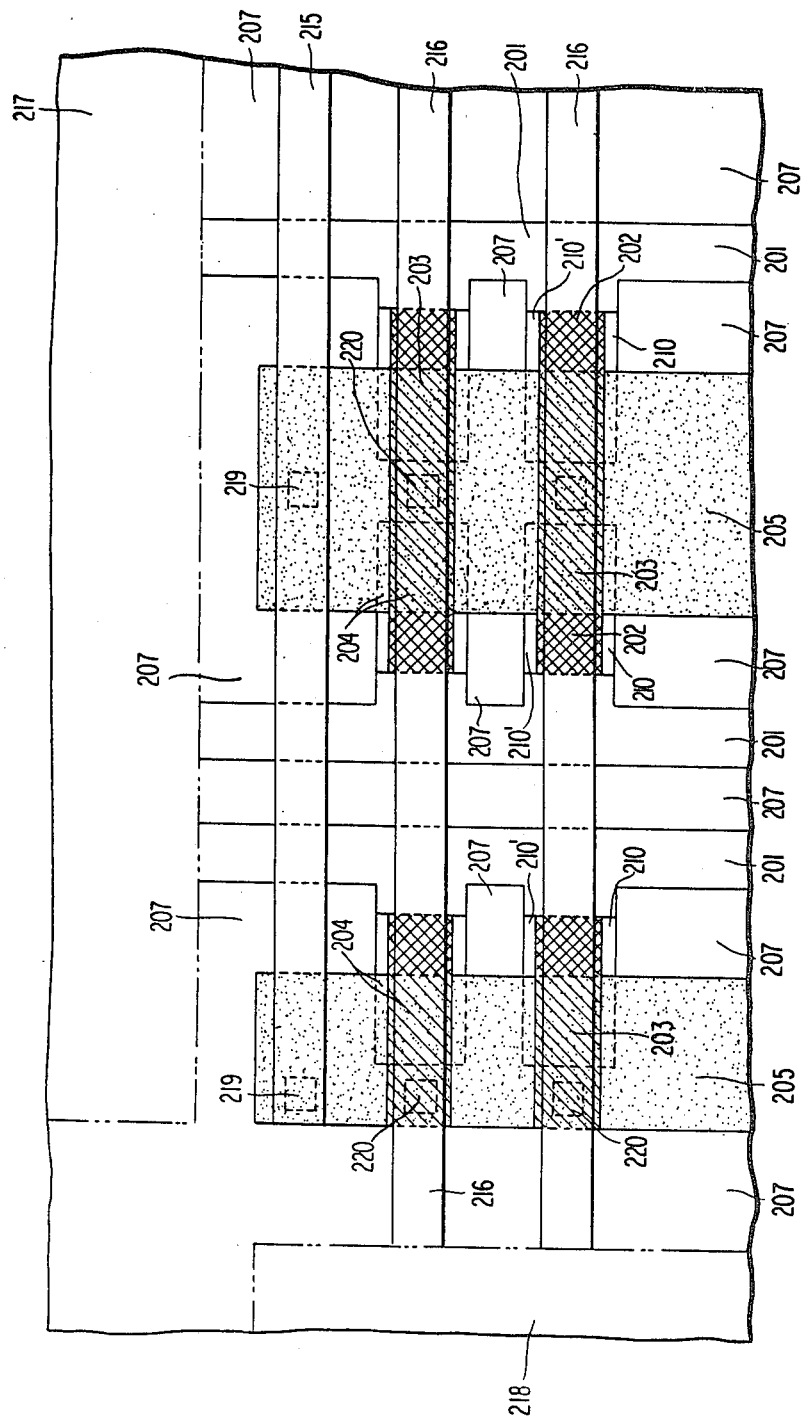
FIG. 3 is a plan view of a memory device in which one-transistor-one-capacitor memory cells according to the present invention as shown in FIGS. 2A and 2B are provided.

FIG. 3 shows a semiconductor memory device in which a plurality of memory cells formed as shown in FIG. 2 are provided. Bit lines 201 which form a part of the source or drain regions are connected to a portion 217 in which bit line drivers and sense amplifiers are formed, whereas word lines 216 made of aluminium, crossing at right angles with the bit lines 201 and connected to gate electrodes 203 of polycrystalline silicon through apertures 220 in an insulator film, are connected to word line drivers at another portion 218. On the other hand, capacitor electrodes 205 on capacitor sections 204 are connected to a fixed potential line 215 through apertures 219 in an insulator film.

Figure 4:
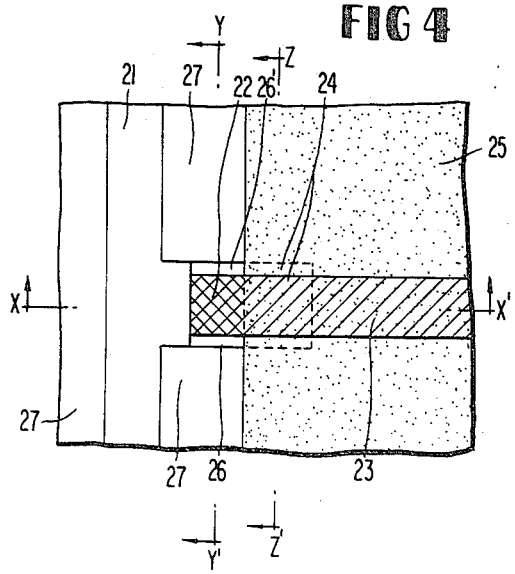
FIG. 4 is a plan view of a second preferred embodiment of the present invention.

Embodiment 2:

FIG. 4 is a plan view of a single-transistor type memory cell according to a second preferred embodiment of the present invention, in which reference numeral 21 designates a bit line region consisting of an impurity layer formed, for example, by thermal diffusion, numeral 22 designates a channel region, and numeral 23 designates a gate electrode of polycrystalline silicon. The section of the bit region 21 that is contiguous to the channel region 22 serves as a source or drain region. In addition, at the other end in the lengthwise direction of the channel region 22 is provided a capacitor section 24 contiguously thereto, and a capacitor electrode 25 is provided thereon. On the other hand, along the width edges of the channel region 22 are provided channel stopper regions 26 and 26' according to the present invention, and outside of these channel stopper regions is provided a thick field oxide film 27. In the case of this second preferred embodiment, under the field oxide film 27 there is no high-concentration impurity region of the same conductivity type as the semiconductor substrate.

Now referring also to FIGS. 5 and 10, a method of production of the memory cell according to the second embodiment of the present invention will be described.

Figure 5:
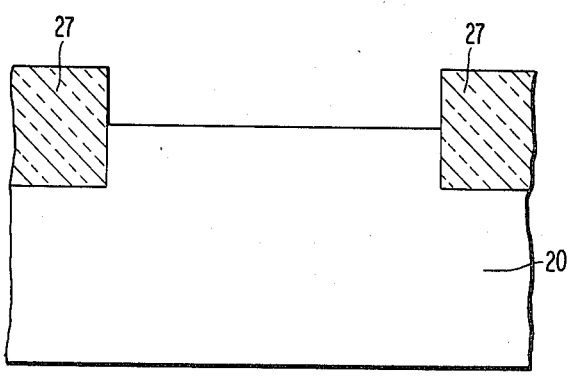
FIGS. 5 through 10 show successive steps in the process for producing the semiconductor device shown in FIG. 4, FIGS. 5, 6, 7 and 10 being partial cross-sectional views taken along line X—X' in FIG. 4 as viewed in the direction of arrows, while FIGS. 8 and 9 being cross-sectional views taken along lines Y—Y' and Z—Z', respectively, in FIG. 4 as viewed in the direction of arrows.

FIG. 5 shows the step of forming an isolating region by producing a silicon dioxide film 37 of 1 $\mu$m in thickness on a P-type silicon substrate 20 having an impurity concentration of $10^{15}/cm^3$ through a known selective oxidation process making use of a silicon nitride film.

Figure 6:
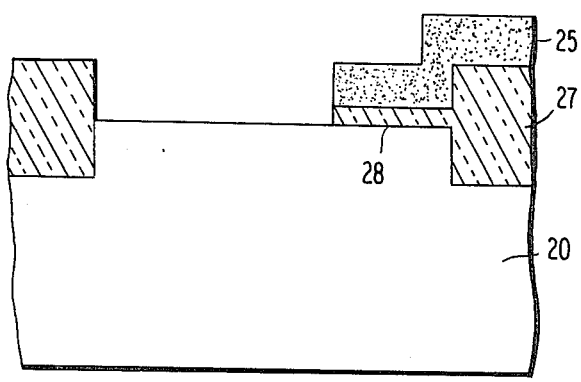

FIG. 6 shows the step of forming the capacitor section. A silicon dioxide film 28 of 500 A in thickness is formed by thermal oxidation at 900° C. on a section where the capacitor is to be produced. A polycrystalline silicon film 25 of 0.5 $\mu$m in thickness containing phosphorus at a concentration of $10^{20}/cm^3$ is deposited thereon through a known chemical vapor deposition, and an insulator film 28 as a dielectric layer of the capacitor and an upper electrode 25 of the capacitor are formed by successively and selectively removing the polycrystalline silicon film and the silicon dioxide film through a photo-etching process.

Figure 7:
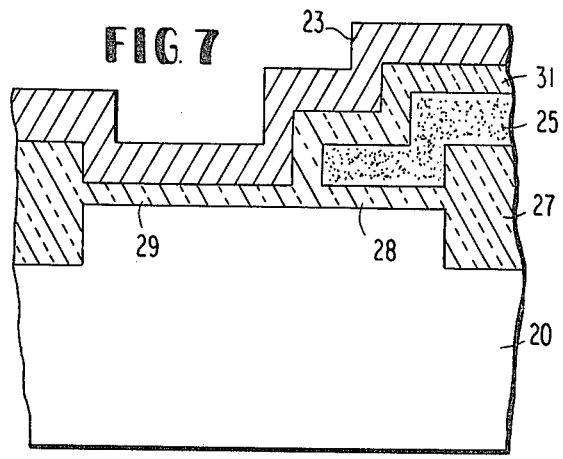

FIG. 7 shows the step of forming the gate section of a source-channel type transistor. A silicon dioxide film 29 of 1000 A in thickness is formed on the region where the element is to be produced and a silicon dioxide film 31 of 3000 A in thickness is formed on the polycrystalline silicon film 25, both by thermal oxidation at 900° C., and a polycrystalline silicon film 23 of 0.5 $\mu$m in thickness containing phosphorus at a concentration of $10^{20}/cm^3$ is deposited thereon through the chemical vapor deposition technique and will be selectively removed to form the gate electrode of the transistor.

Figure 8:
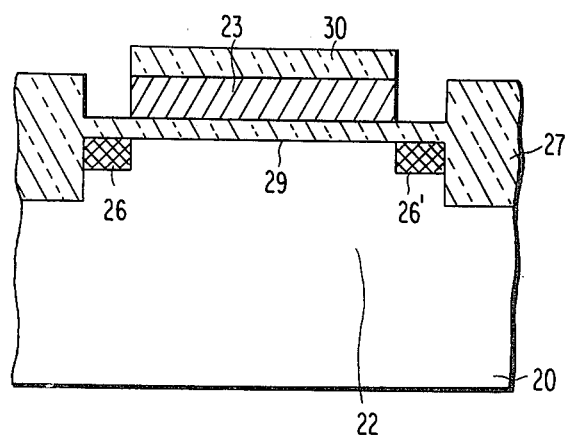
Figure 9:
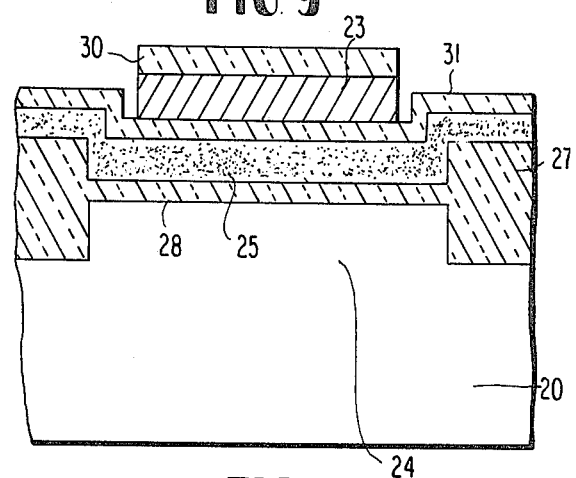

FIGS. 8 and 9 are cross-sectional views taken along the Y—Y' line at the channel section and Z—Z' line at the capacitor section. Only the polycrystalline silicon film 23 along the width edges of an insulated gate field effect transistor is removed selectively through a photo-etching process making use of a photo-resist 30 while retaining the silicon dixode films 29 and 31, and under such condition, boron is injected at 50 KeV and $10^{13}/cm^2$ by an ion injection process through the silicon dioxide film 29. Thereby the channel stopper regions 26 and 26' according to the present invention can be formed in a self-aligning mode along the width edges of the transistor, having an impurity concentration of of $1 \times 10^{17}/cm^3$ and a depth of 1.0 $\mu$m. These regions 26 and 26' are not formed at the capacitor section.

Figure 10:
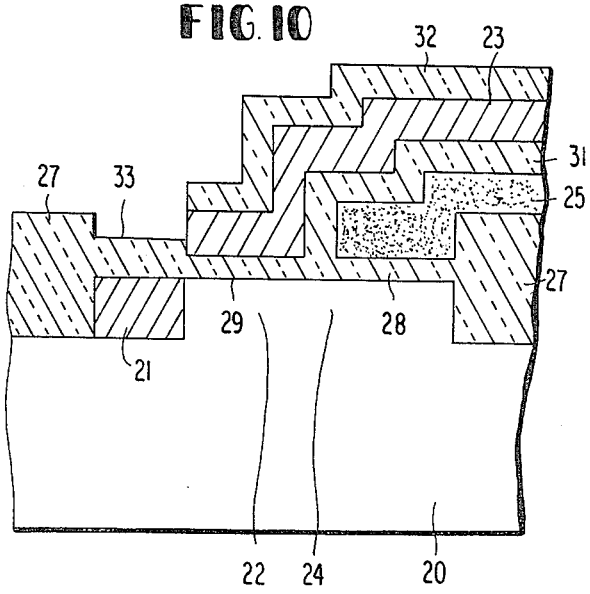

FIG. 10 is a cross-sectional view taken along the X-direction. The polycrystalline film 23 along the length edges of the transistor is removed through a repeated photo-etching process making use of a photo-resist 32 to define the length edges of the gate electrode 23. Still further, a source region 21 having an impurity concentration of $10^{20}/cm^3$ is formed in a self-aligning mode along the length edge of the channel region 22 through a phosphorus ion injection process making use of this photo-resist 32. Thereafter, a silicon dioxide film 33 of 0.5 $\mu$m in thickness is formed on the source region 21 and on the silicon dioxide film 29 covering the channel stopper regions 26 and 26' through the chemical vapor deposition process, and then a metallic wiring layer is formed to complete the device.

While the above-described embodiment is illustrated in connection to a source-channel type transistor, the same process is equally applicable to the manufacture of a field effect transistor having both source and drain regions at the opposite ends of the channel region. In the above-described manufacturing process, while doped polycrystalline silicon is employed in the two times of formation of a polycrystalline silicon film, it may be formed by diffusing phosphorus or the like into an undoped polycrystalline silicon film through a thermal diffusion process at 1000° C. In addition, one or both of the electrodes 23 and 25, especially the electrode 23 can be made of conductive materials other than polycrystalline silicon such as, for example, Al, Mo, etc. with an insulator interposed between the electrodes.

Figure 11:
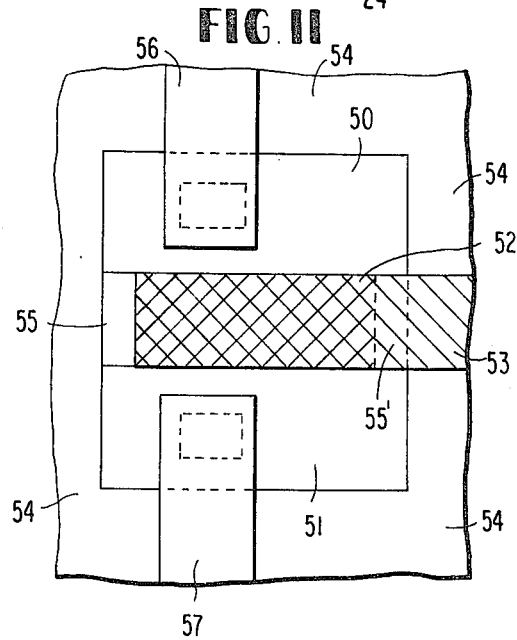
FIG. 11 is a plan view showing a third preferred embodiment of the present invention.

Embodiment 3:

With reference to FIG. 11, a channel region 52 (with the double cross hatching) is provided between a source region 50 and a drain region 51, and these regions are surrounded by a thick field silicon oxide film 54. And channel stopper regions 55 and 55' of the same conductivity type as the semiconductor substrate and having a high impurity concentration according to the present invention, are formed between the width edges of the channel region 52 and a thick field silicon oxide film 54. In this preferred embodiment, since a gate electrode 53 (with the single cross hatching) extends in the direction at right angle to the lengthwise direction of the channel region 52, that is, in its widthwise direction, among the channel stopper regions 55 and 55' according to the present invention at least the region 55' cannot be formed in a self-aligning mode with the gate electrode 53. In this figure, a source electrode 56 and a drain electrode 57 are respectively connected to the source region 50 and drain region 51.

On the other hand, in the device shown in FIG. 11, if a modified arrangement is employed in which a gate electrode, having a width of the distance between regions 55 and 55', extends in the lengthwise direction of the channel region 52 over the source or drain region and its electrode via an insulator film, then the source and drain region cannot be formed in a self-aligning mode with the gate electrode, but both the channel stopper regions 55 and 55' according to the present invention, can be formed in a self-aligning mode with the gate electrode.

We claim:

1. A method for manufacturing a semiconductor device comprising the steps of forming an isolating region including a field oxide film on one major surface of semicondutor substrate of one conductivity type, forming a gate insulator film on said one major surface of said semiconductor substrate at a position surrounded by said isolating region, depositing on said gate insulator film a conductive film to provide a gate electrode, shaping the width edges of said gate electrode, and thereafter introducing impurities of said one conductivity type into said semiconductor substrate between the width edges of said gate electrode and said field oxide film opposed thereto to form a channel stopper region so that a boundary line of said channel stopper region is substantially in coincidence with said width edge of said gate electrode in the plane view.

2. A method for manufacturing a semiconductor device of claim 1, further comprising the steps of shaping the length edge of said gate electrode and introducing impurities of the opposite conductivity type into said one major surface of said semiconductor substrate between the length edge of said gate electrode and said field oxide film opposed thereto to form a source or drain region.

3. A method for manufacturing a semiconductor device of claim 1, in which said conductive film is a polycrystalline silicon film.

4. A method for manufacturing a semiconductor device of claim 1, in which said conductive film is a molybdenum film.

5. A method for manufacturing a semiconductor device of claim 1, in which said impurities of said one conductivity type are introduced by ion implantation through said gate insulator film entending from under said gate electrode to said field oxide film.

* * * * *

UNITED STATES PATENT AND TRADEMARK OFFICE
CERTIFICATE OF CORRECTION

PATENT NO. : 4,357,747
DATED : November 9, 1982
INVENTOR(S) : Osamu KURAKAMI et al.

It is certified that error appears in the above—identified patent and that said Letters Patent is hereby corrected as shown below:

Col. 2, line 22, change "a width" to --the width--;
　　　　line 62, change "if" to --with--.

Col. 3, line 10, change "may be" to --can be--.

Col. 4, line 65, change "for" to --of--.

Col. 6, line 14, change "($\infty$0.5µm)" to --($\cong$0.5µm)--;
　　　　line 37, delete "the";
　　　　line 37, change "only of regions" to --only one of the regions--.

Col. 7, line 31, change "film 37" to --film 27--.

Signed and Sealed this

Nineteenth Day of April 1983

[SEAL]

Attest:

GERALD J. MOSSINGHOFF

Attesting Officer　　Commissioner of Patents and Trademarks

Disclaimer 4,357,747.—*Osamu Kurakami, Shigeru Koshimaru* and *Takashi Yamanaka*, Tokyo, Japan. METHOD FOR PRODUCING A SEMICONDUCTOR DEVICE HAVING AN INSULATED GATE TYPE FIELD EFFECT TRANSISTOR. Patent dated Nov. 9, 1982. Disclaimer filed Sept. 29, 1983, by the assignee, *NEC Corp.*

Hereby enters this disclaimer to claims 1 and 5 of said patent.
[*Official Gazette February 14, 1984.*]